(12) United States Patent
Williams

(10) Patent No.: US 6,376,938 B1
(45) Date of Patent: Apr. 23, 2002

(54) POWER SUPPLY INTERFACE DEVICE

(76) Inventor: Alonzo Williams, 6002 Rampart #109, Houston, TX (US) 77081

( * ) Notice: Subject to any disclaimer, the term of this patent is extended or adjusted under 35 U.S.C. 154(b) by 56 days.

(21) Appl. No.: 09/586,018

(22) Filed: Jun. 2, 2000

(51) Int. Cl.[7] ................................................. H02J 7/00
(52) U.S. Cl. ........................ 307/150; 307/149; 324/133; 324/508
(58) Field of Search ........................ 307/150, 71, 75, 307/147, 149; 320/105; 439/507, 952, 502; 324/133, 508

(56) References Cited

U.S. PATENT DOCUMENTS

| | | | |
|---|---|---|---|
| 4,131,805 A | * 12/1978 | Austin et al. | ................ 307/147 |
| D251,367 S | 3/1979 | Tucker | |
| 4,143,317 A | 3/1979 | Pogue et al. | |
| 4,261,634 A | 4/1981 | Robinson | |
| 4,488,201 A | * 12/1984 | Webb et al. | ................ 361/334 |
| 5,599,204 A | 2/1997 | Glassford | |
| 5,684,689 A | * 11/1997 | Hain | ........................... 363/146 |
| 6,049,142 A | * 4/2000 | Wakefield | ..................... 307/75 |
| 6,163,085 A | * 12/2000 | Sigl et al. | ...................... 307/43 |

* cited by examiner

Primary Examiner—Josie C B Ballato
Assistant Examiner—Robert L. Deberadinis

(57) ABSTRACT

A power supply interface device for supplying 110 volt power to an electrical device. The power supply interface device includes a housing having a front wall, a top end wall, and a bottom end wall; and also includes a plurality of wire members extending through the top end wall into the housing with, each of said wire members having an end; and further includes a power cord extending through the bottom end wall into the housing and having an end with a plug-receiving member securely attached to the end of the power cord and being adapted to detachably connect to an electrical device; and also includes a voltage sensing and converting assembly for detecting and converting voltage being transmitted through the wire members; and further includes indicator members securely disposed in the front wall of the housing and being connected to the voltage sensing and converting assembly for indicating voltage being transmitted through the wires members; and also includes clamping members for connecting the wire members to a power supply; and further includes a light-emitting member and a switch member for controlling and indicating voltage being transmitted to the power cord.

7 Claims, 2 Drawing Sheets

POWER SUPPLY INTERFACE DEVICE

BACKGROUND OF THE INVENTION

1. Field of the Invention

The present invention relates to a power transferring device and more particularly pertains to a new power supply interface device for supplying 110 volt power to an electrical device.

2. Description of the Prior Art

The use of a power transferring device is known in the prior art. More specifically, a power transferring device heretofore devised and utilized are known to consist basically of familiar, expected and obvious structural configurations, notwithstanding the myriad of designs encompassed by the crowded prior art which have been developed for the fulfillment of countless objectives and requirements.

Known prior art includes U.S. Pat. No. 4,261,634; U.S. Pat. No. 3,863,150; U.S. Pat. No. 2,705,773; U.S. Pat. No. 5,599,204; U.S. Pat. No. Des. 251,367; and U.S. Pat. No. 4,143,317.

While these devices fulfill their respective, particular objectives and requirements, the aforementioned patents do not disclose a new power supply interface device. The inventive device includes a housing having a front wall, a top end wall, and a bottom end wall; and also includes a plurality of wire members extending through the top end wall into the housing with, each of said wire members having an end; and further includes a power cord extending through the bottom end wall into the housing and having an end with a plug-receiving member securely attached to the end of the power cord and being adapted to detachably connect to an electrical device; and also includes a voltage sensing and converting assembly for detecting and converting voltage being transmitted through the wire members; and further includes indicator members securely disposed in the front wall of the housing and being connected to the voltage sensing and converting assembly for indicating voltage being transmitted through the wires members; and also includes clamping members for connecting the wire members to a power supply; and further includes a light-emitting member and a switch member for controlling and indicating voltage being transmitted to the power cord.

In these respects, the power supply interface device according to the present invention substantially departs from the conventional concepts and designs of the prior art, and in so doing provides an apparatus primarily developed for the purpose of supplying 110 volt power to an electrical device.

SUMMARY OF THE INVENTION

In view of the foregoing disadvantages inherent in the known types of power transferring device now present in the prior art, the present invention provides a new power supply interface device construction wherein the same can be utilized for supplying 110 volt power to an electrical device.

The general purpose of the present invention, which will be described subsequently in greater detail, is to provide a new power supply interface device which has many of the advantages of the power transferring device mentioned heretofore and many novel features that result in a new power supply interface device which is not anticipated, rendered obvious, suggested, or even implied by any of the prior art power transferring device, either alone or in any combination thereof.

To attain this, the present invention generally comprises a housing having a front wall, a top end wall, and a bottom end wall; and also includes a plurality of wire members extending through the top end wall into the housing with, each of said wire members having an end; and further includes a power cord extending through the bottom end wall into the housing and having an end with a plug-receiving member securely attached to the end of the power cord and being adapted to detachably connect to an electrical device; and also includes a voltage sensing and converting assembly for detecting and converting voltage being transmitted through the wire members; and further includes indicator members securely disposed in the front wall of the housing and being connected to the voltage sensing and converting assembly for indicating voltage being transmitted through the wires members; and also includes clamping members for connecting the wire members to a power supply; and further includes a light-emitting member and a switch member for controlling and indicating voltage being transmitted to the power cord.

There has thus been outlined, rather broadly, the more important features of the invention in order that the detailed description thereof that follows may be better understood, and in order that the present contribution to the art may be better appreciated. There are additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new power supply interface device which has many of the advantages of the power transferring device mentioned heretofore and many novel features that result in a new power supply interface device which is not anticipated, rendered obvious, suggested, or even implied by any of the prior art power transferring device, either alone or in any combination thereof.

It is another object of the present invention to provide a new power supply interface device which may be easily and efficiently manufactured and marketed.

It is a further object of the present invention to provide a new power supply interface device which is of a durable and reliable construction.

An even further object of the present invention is to provide a new power supply interface device which is susceptible of a low cost of manufacture with regard to both materials and labor, and which accordingly is then susceptible of low prices of sale to the consuming public, thereby making such power supply interface device economically available to the buying public.

Still yet another object of the present invention is to provide a new power supply interface device which provides in the apparatuses and methods of the prior art some of the advantages thereof, while simultaneously overcoming some of the disadvantages normally associated therewith.

Still another object of the present invention is to provide a new power supply interface device for supplying 110 volt power to an electrical device.

Yet another object of the present invention is to provide a new power supply interface device which includes a housing having a front wall, a top end wall, and a bottom end wall; and also includes a plurality of wire members extending through the top end wall into the housing with, each of said wire members having an end; and further includes a power cord extending through the bottom end wall into the housing and having an end with a plug-receiving member securely attached to the end of the power cord and being adapted to detachably connect to an electrical device; and also includes a voltage sensing and converting assembly for detecting and converting voltage being transmitted through the wire members; and further includes indicator members securely disposed in the front wall of the housing and being connected to the voltage sensing and converting assembly for indicating voltage being transmitted through the wires members; and also includes clamping members for connecting the wire members to a power supply; and further includes a light-emitting member and a switch member for controlling and indicating voltage being transmitted to the power cord.

Still yet another object of the present invention is to provide a new power supply interface device that allows the user to use the existing units found on a roof, for example, to power an electrical device also needed to be used on the roof.

Even still another object of the present invention is to provide a new power supply interface device that eliminates the user from having to run power cords from inside the house to the roof.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be made to the accompanying drawings and descriptive matter in which there are illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
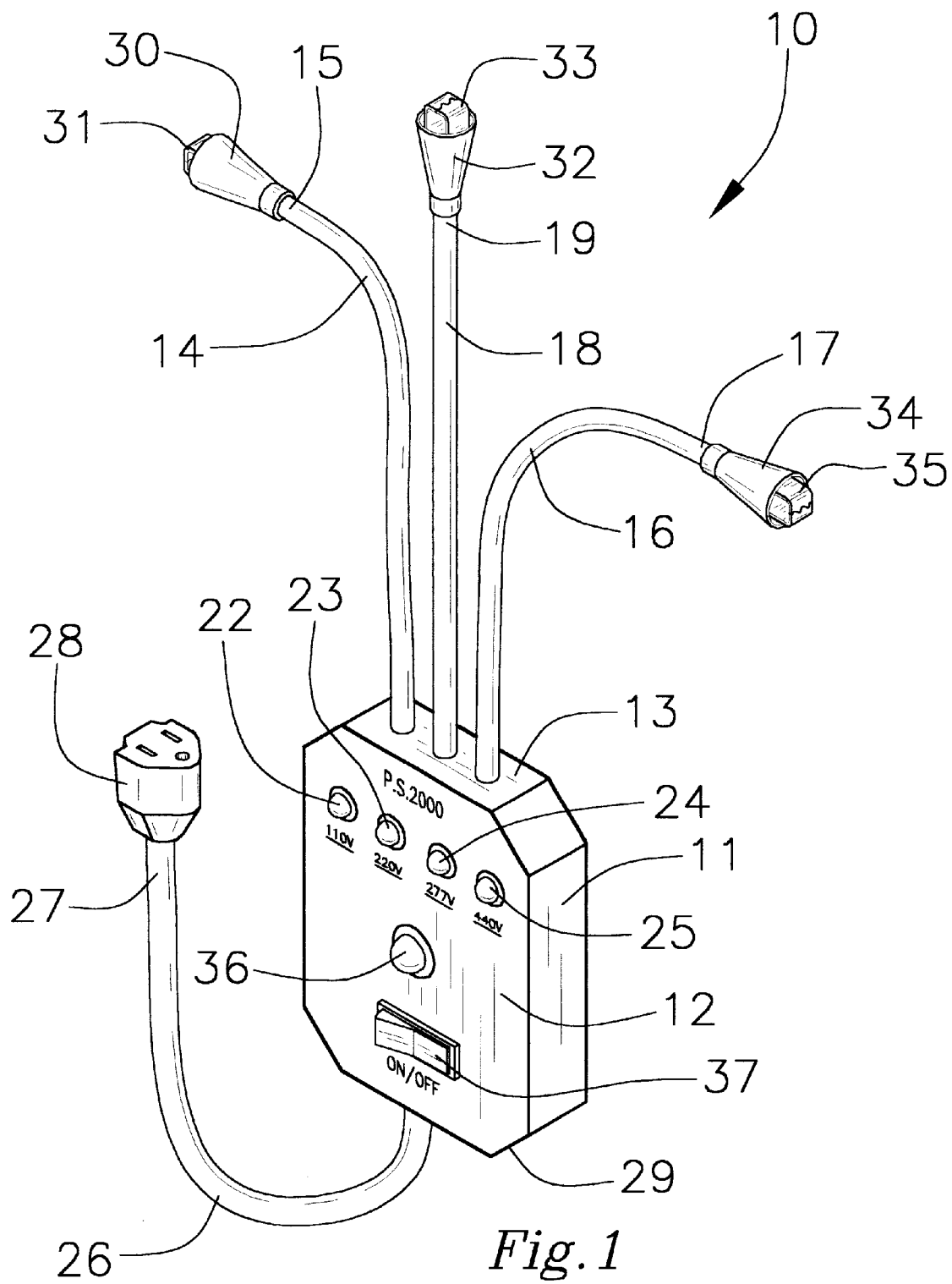
FIG. 1 is a perspective view of a new power supply interface device according to the present invention.
Figure 2:
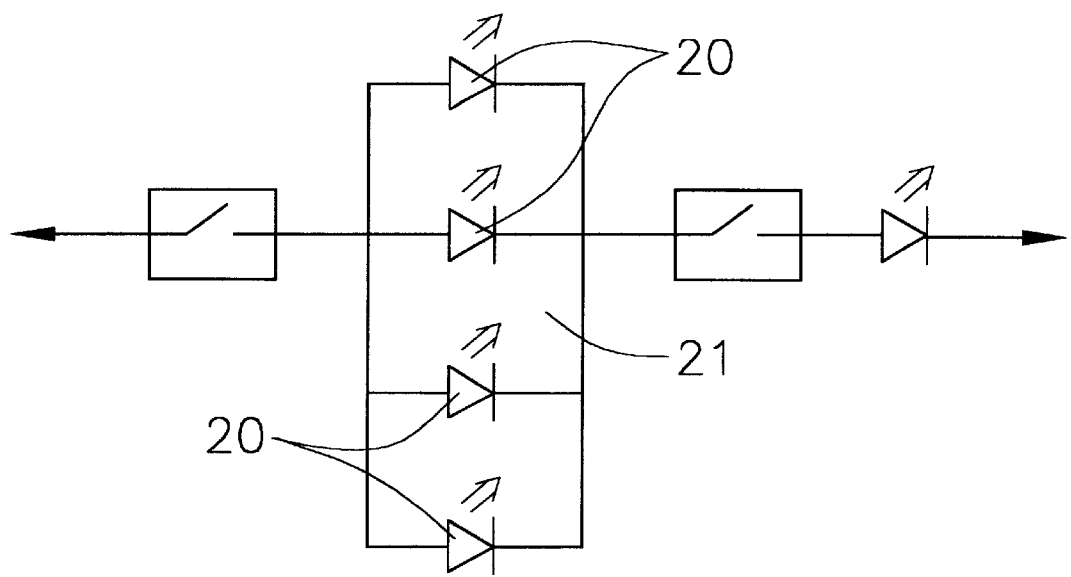
FIG. 2 is a schematic diagram of the present invention.
Figure 3:
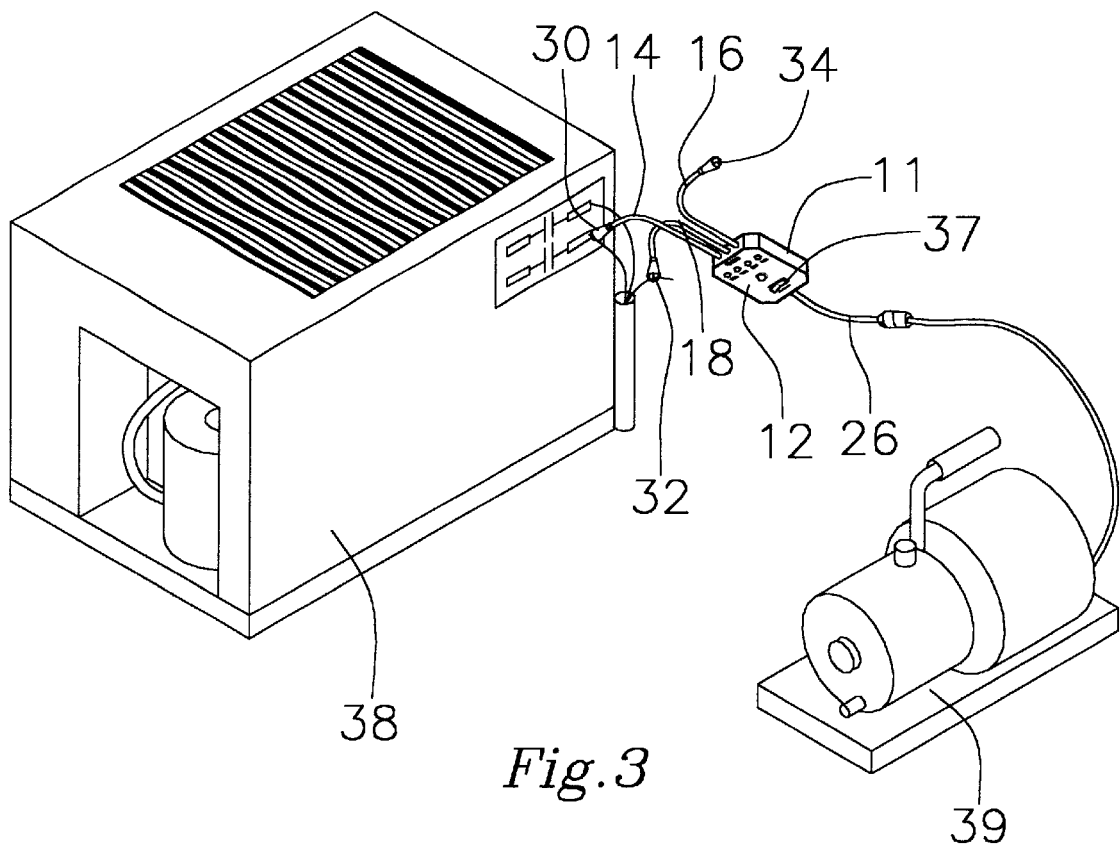
FIG. 3 is a perspective view of the present invention shown in use.

With reference now to the drawings, and in particular to FIGS. 1 through 3 thereof, a new power supply interface device embodying the principles and concepts of the present invention and generally designated by the reference numeral 10 will be described.

As best illustrated in FIGS. 1 through 3, the power supply interface device 10 generally comprises a portable housing 11 having a front wall 12, a top end wall 13, and a bottom end wall 29. A plurality of wire members 14, 16, 18 extend through the top end wall 12 into the housing 11 with each of the wire members 14, 16, 18 having an end 15, 17, 19. The wire members 14, 16, 18 include live wires 14, 16 and a ground wire 18. A power cord 26 extends through the bottom end wall 29 into the housing 11 and has an end 27 with a plug-receiving member 28 securely and conventionally attached to the end 27 of the power cord 26 and being adapted to detachably connect to an electrical device 39. Voltage sensing and converting means for detecting and converting voltage being transmitted through the wire members 14, 16, 18 includes a sensor 21 which is conventionally connected to the wire members 14, 16, 18 and which is securely and conventionally disposed inside the housing 11, and also includes a voltage converter 22 securely disposed in the housing 11 and being connected to the sensor 21 for converting voltage to 110.

Indicator members 22–25 are securely and conventionally disposed in the front wall 12 of the housing 11 and are connected to the sensor 21 for indicating voltage being transmitted through the wire members 14, 16, 18 from the power supply 38. The indicator members 22–25 are essentially light-emitting members with each one being conventionally connected to the sensor 21 for indicating a particular voltage being received from the power supply 38. One of the light-emitting members 22 is used to indicate 110 volts; another of the light-emitting members 23 is used to indicate 220 volts; also another of the light-emitting members 24 is used to indicate 277 volts; and yet another of the light-emitting members 25 is used to indicate 440 volts. Means for detachably connecting the wire members 14, 16, 18 to a power supply 38 includes clamping members 30, 32, 34 each of which is securely and conventionally attached to the end 15, 17, 19 of a respective wire member 14, 16, 18, and each of which includes a pair of jaw members 31, 33, 35 biasedly disposed toward one another. The jaw members 31, 33, 35 are adapted to clamp about a portion of the power supply 38.

Means for controlling and indicating voltage being transmitted to the power cord 26 includes a light-emitting member 36 securely and conventionally disposed in the front wall 12 of the housing 11 and being conventionally connected to the voltage converter 20, and also includes a switch member 37 being movably and conventionally disposed in the front wall 12 of the housing 11 and being conventionally connected to the power cord 26 and to the voltage converter 20.

In use, the user attaches the wire members 14, 16, 18 to the appropriate power supply 38 such as a roof air conditioning unit and then connects the power cord 26 to the electrical device 39 the user is wanting to use. The user turns on the switch member 37 to allow the voltage from the power supply 38 to be transmitted to the electrical device 39 in order to energize and operate the electrical device 39.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. A power supply interface device comprising:
   a housing;
   a plurality of input wires extending from said housing, each of said wire members having an end for connecting to a conductor of a power source;
   a power output cord extending from said housing, said power output cord having an end with a plug-receiving member thereon for detachably connecting to an electrical device;
   voltage sensing and converting means for detecting and converting voltage of power being transmitted through said input wires from the power source when said input wires are connected to the conductors of the power source;
   indicator means for detecting and indicating a magnitude of voltage being applied to said input wires by the power source when said input wires are connected to the conductors of the power source, said indicator means being disposed on said housing and being connected to said voltage sensing and converting means;
   connecting means for detachably connecting said wire members to the power source; and
   controlling means for controlling transmission of power to said power output cord.

2. A power supply interface device as described in claim 1, wherein said input wires include a wire for connecting to positive, negative, and ground terminals.

3. A power supply interface device as described in claim 1, wherein said voltage sensing and converting means includes:
   a sensor mounted on said housing and connected to said indicator members and to said input wires; and
   a voltage converter mounted on said housing and being connected to said sensor.

4. A power supply interface device as described in claim 3, wherein said indicator means comprises light-emitting members, each said light-emitting member being connected to said sensor for indicating a particular voltage being received from the power source.

5. A power supply interface device as described in claim 3, wherein said controlling means includes:
   a light-emitting member disposed on said housing and being connected to said voltage converter; and
   a switch member being movably disposed on said housing and being connected to said power output cord and to said voltage converter.

6. A power supply interface device as described in claim 1, wherein said connecting means includes clamping members each of which is attached to said end of one of said input wires, and each of said clamping members including a pair of jaw members biasedly disposed toward one another, said jaw members being adapted to clamp about a portion of the power source.

7. A power supply interface device comprising:
   a housing;
   a plurality of input wires extending from said housing, each of said wire members having an end for connecting to a conductor of a power source;
   a power output cord extending from said housing, said power output cord having an end with a plug-receiving member thereon for detachably connecting to an electrical device;
   voltage sensing and converting means for detecting and converting voltage of power being transmitted through said input wires from the power source when said input wires are connected to the conductors of the power source;
   indicator means for detecting and indicating a magnitude of voltage being applied to said input wires by the power source when said input wires are connected to the conductors of the power source, said indicator means being disposed on said housing and being connected to said voltage sensing and converting means;
   connecting means for detachably connecting said wire members to the power source; and
   controlling means for controlling transmission of power to said power output cord;
   wherein said input wires include a wire for connecting to positive, negative, and ground terminals;
   wherein said voltage sensing and converting means includes:
      a sensor mounted on said housing and connected to said indicator means and to said input wires; and
      a voltage converter mounted on said housing and being connected to said sensor, said voltage converter converting the voltage of power applied to the input wires to approximately 110 volts;
   wherein said indicator means comprises light-emitting members, each said light-emitting member being connected to said sensor for indicating a particular voltage being received from the power source;
   wherein said connecting means includes clamping members each of which is attached to said end of one of said input wires, and each of said clamping members including a pair of jaw members biasedly disposed toward one another, said jaw members being adapted to clamp about a portion of the power source;
   wherein said controlling means includes:
      a light-emitting member disposed on said housing and being connected to said voltage converter; and
      a switch member being movably disposed on said housing and being connected to said power output cord and to said voltage converter.

* * * * *